(12) United States Patent
Yoon et al.

(10) Patent No.: US 7,588,996 B2
(45) Date of Patent: Sep. 15, 2009

(54) OXIDE PATTERN FORMING METHOD AND PATTERNING METHOD OF SEMICONDUCTOR DEVICE

(75) Inventors: Hyo Geun Yoon, Yongin-si (KR); Woo Jin Kim, Icheon-si (KR); Dong Joo Kim, Pusan-si (KR); Ji Yong Park, Seoul (KR); Yong Soo Jung, Seoul (KR); Geun Min Choi, Icheon-si (KR); Young Wok Song, Icheon-si (KR); Sang Hyun Lee, Icheon-si (KR)

(73) Assignee: Hynix Semiconductor Inc., Icheon-Si (KR)

( * ) Notice: Subject to any disclaimer, the term of this patent is extended or adjusted under 35 U.S.C. 154(b) by 124 days.

(21) Appl. No.: 11/770,983

(22) Filed: Jun. 29, 2007

(65) Prior Publication Data

US 2008/0132073 A1    Jun. 5, 2008

(30) Foreign Application Priority Data

Dec. 4, 2006   (KR) .................. 10-2006-012414

(51) Int. Cl.
   *H01L 21/76* (2006.01)
(52) U.S. Cl. .............. 438/444; 438/700; 438/783; 257/E21.553
(58) Field of Classification Search ......... 438/424–439, 438/444, 700, 783; 257/E21.454, E21.546, 257/E21.548, E21.549, E21.553
See application file for complete search history.

(56) References Cited

U.S. PATENT DOCUMENTS

| | | | | |
|---|---|---|---|---|
| 5,470,770 A | * | 11/1995 | Takahashi et al. | 438/297 |
| 6,316,329 B1 | * | 11/2001 | Hirota et al. | 438/424 |
| 6,723,617 B1 | * | 4/2004 | Choi | 438/424 |

FOREIGN PATENT DOCUMENTS

| | | |
|---|---|---|
| JP | 2006310591 | 11/2006 |
| KR | 10-1997-0003634 | 1/1997 |
| KR | 10-1997-0053495 | 7/1997 |
| KR | 10-2005-0067500 | 7/2005 |

OTHER PUBLICATIONS

Yoon et al., "The Effect of Various Process Induced Damages on Wet Etching Rate Difference," published in Abstract Book of Ultra Clean Processing of Semiconductor Surfaces 8$^{th}$ International Symposium, Sep. 17-20, 2006, Antwerp, Belgium, pp. 48-49.

* cited by examiner

*Primary Examiner*—Brook Kebede
(74) *Attorney, Agent, or Firm*—Marshall, Gerstein & Borun LLP (57) ABSTRACT

An oxide pattern forming method comprises forming an oxide layer on a semiconductor substrate, implanting boron ions of not less than $1.0 \times 10^{16}$ atoms/cm$^2$ onto the oxide layer in a given region, and wet-etching the oxide layer in the remaining region where the boron ions are not implanted.

20 Claims, 4 Drawing Sheets

OXIDE PATTERN FORMING METHOD AND PATTERNING METHOD OF SEMICONDUCTOR DEVICE

CROSS-REFERENCE TO RELATED APPLICATION

The priority of Korean patent application number 10-2006-121414, filed on Dec. 4, 2006, the disclosure which is incorporated by reference in its entirety, is claimed.

BACKGROUND OF THE INVENTION

The invention relates to a semiconductor device manufacturing method and, more particularly, to an oxide pattern forming method and a patterning method of a semiconductor device using the same.

A hard mask is generally used to form various components, such as a device isolation layer, a landing plug poly contact, a gate, a bit line, or a storage node, for example, by patterning during a semiconductor device manufacturing process.

Basically, it is necessary for the hard mask to be formed of a material layer satisfying the following several requirements.

First, it is necessary for the hard mask to be formed of a material layer which has a high etching selectivity, which can be easily patterned, and which has high deposition uniformity. In addition, it is necessary that by-products not be produced when the material layer used to form the hard mask is deposited on a patterning target layer. According to circumstances, it is necessary that the material layer have a low dielectric constant.

The hard mask satisfying the above-specified requirements is generally formed using a silicon nitride, polysilicon, a tungsten nitride, tungsten, or a silicon oxy-nitride depending upon the kinds of lower patterning target layers and the kinds of patterns formed through the patterning of the lower patterning target layers.

However, the silicon nitride, the polysilicon, the tungsten nitride, the tungsten, or the silicon oxy-nitride is not a material layer commonly used during semiconductor device manufacturing processes. For this reason, it is necessary to provide an additional apparatus for forming and patterning the hard mask at the respective patterning processes for forming various components of a semiconductor device and to set the additional apparatus in order to form the hard mask using the above-specified material layer. As a result, the semiconductor device manufacturing process is complicated, and therefore economic efficiency decreases.

In addition, it is necessary for the hard mask formed of the above-specified material layer to protect the lower patterning target layer during the patterning process using the hard mask. To this end, the hard mask generally exhibits a low etching rate. For this reason, particles resulting from the hard mask may be left over or by-products may be produced by the reaction between the hard mask and the patterning target layer during the removal of the hard mask after patterning the patterning target layer. Consequently, the defective proportion of semiconductor devices increases, and therefore the yield rate and characteristics of the semiconductor devices are deteriorated.

BRIEF SUMMARY OF THE INVENTION

In accordance with one aspect, the invention provides an oxide pattern forming method comprising forming an oxide layer on a semiconductor substrate, implanting boron ions of at least $1.0 \times 10^{16}$ atoms/cm$^2$ onto the oxide layer in a first region, and wet-etching the oxide layer in a second region where the boron ions are not implanted.

The oxide layer preferably includes a thermal oxide layer, Plasma Enhanced Tetraethylorthosilicate (PE-TEOS), Low-Pressure Tetraethylorthosilicate (LP-TEOS), Undoped Silicate Glass (USG), Phospho Silicate Glass (PSG), Boron-Doped Phosphosilicate Glass (BPSG), Spin-On Dielectric (SOD), Silicon Oxynitride (SiON), Ozone Tetraethylorthosilicate (O$_3$-TEOS), or Plasma Enhanced Tetraethylorthosilicate (PE-TEOS).

The oxide layer is preferably formed such that the oxide layer has a thickness greater than twice the depth to which boron ions are implanted.

The etchant preferably includes diluted hydrofluoric acid (DHF) or buffered oxide etchant (BOE), preferably used at the step of wet-etching the oxide layer.

Preferably, the oxide pattern forming method further comprises implanting ions of $1.0 \times 10^{15}$ atoms/cm$^2$ or less onto the oxide layer in the second region where the boron ions are not implanted before the step of wet-etching the oxide layer. At this time, ions preferably including boron, arsenic, or phosphorus are preferably implanted onto the oxide layer in the second region where the boron ions are not implanted.

The boron ions are preferably implanted onto the oxide layer with energy of 5 KeV to 20 KeV.

The boron ions is preferably implanted onto the oxide layer at an angle of 10 degrees or less.

A patterning target layer below the oxide layer is preferably patterned with the oxide pattern resulting from the step of wet-etching the oxide layer being used as a mask.

In accordance with another aspect, the invention provides a patterning method of a semiconductor device comprising sequentially forming a patterning target layer and an oxide layer on a semiconductor substrate, implanting boron ions of at least $1.0 \times 10^{16}$ atoms/cm$^2$ onto the oxide layer in a first region where an oxide pattern is to be formed, wet-etching the oxide layer in a second region where the boron ions are not implanted to form an oxide pattern, and patterning the patterning target layer with the oxide pattern being used as a mask.

The patterning method preferably further comprises removing the oxide pattern after the step of patterning the patterning target layer. At this time, the oxide pattern is preferably removed by wet etching.

The oxide layer preferably includes a thermal oxide layer, PE-TEOS, LP-TEOS, USG, PSG, BPSG, SOD, SiON, O$_3$-TEOS, or PE-TEOS.

The oxide layer is preferably formed such that the oxide layer has a thickness greater than twice the depth to which boron ions are implantated.

An etchant including DHF or BOE is preferably used at the step of wet-etching the oxide layer.

Preferably, the patterning method further comprises implanting ions of $1.0 \times 10^{15}$ atoms/cm$^2$ or less onto the oxide layer in the second region where the boron ions are not implanted before the step of wet-etching the oxide layer. At this time, ions preferably including boron, arsenic, or phosphorus are preferably implanted onto the oxide layer in the second region where the boron ions are not implanted.

The boron ions are preferably implanted onto the oxide layer with energy of 5 KeV to 20 KeV.

The boron ions are preferably implanted onto the oxide layer at an angle of 10 degrees or less.

The oxide pattern preferably defines a region where a device isolation trench is to be formed, and the patterning target layer preferably comprises the semiconductor substrate.

DESCRIPTION OF SPECIFIC EMBODIMENTS

An oxide pattern forming method according to an embodiment of the invention comprises forming an oxide layer on a semiconductor substrate, implanting boron ions of at least $1.0 \times 10^{16}$ atoms/cm$^2$ onto the oxide layer in a first region, and wet-etching the oxide layer in a second region where the boron ions are not implanted.

The oxide pattern forming method is realized based on the discovery made by the present inventors, as described below.

Although there is a difference depending upon kinds of oxide layers and kinds of etchants used to etch oxide layers, it is generally known that an oxide layer exhibits a wet etching rate higher (for example, two to seven times) when impurity ions are implanted in the oxide layer than when impurity ions are not implanted in the oxide layer. This is because an oxide layer interface is damaged and silicon-oxygen coupling in the oxide layer is partially broken by the implantation of the impurity ions, whereby the oxide layer is subject to a state in which the oxide layer can be easily etched.

Also, it is known that, as the atomic weight, the implantation amount, and the implantation energy of the impurity ions implanted in the oxide layer increase, the above-described phenomenon is prominent, and therefore the wet etching rate of the oxide layer increases proportionally.

Figure 1:
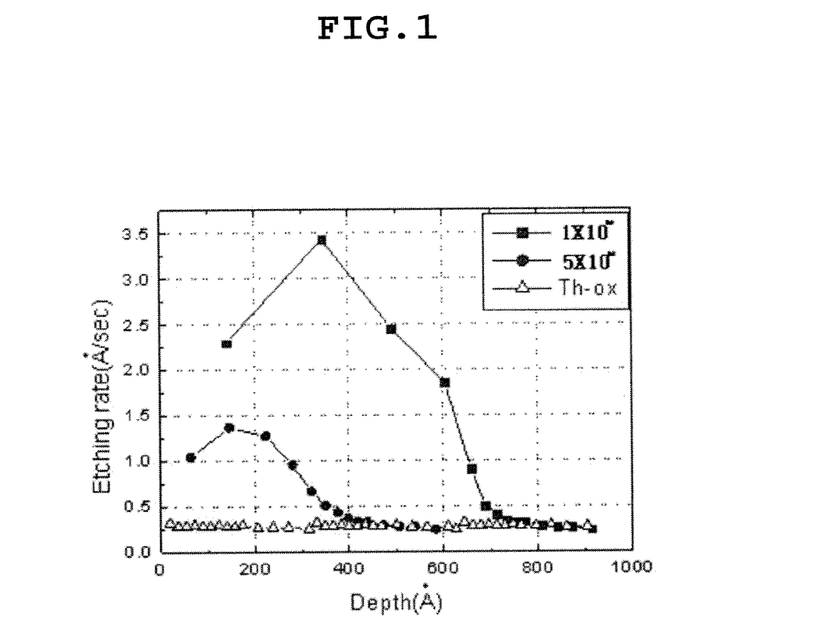
FIG. 1 is a graph illustrating the change in etching rate depending upon the depth of a thermal oxide layer having phosphorus ions of a given concentration implanted therein.
Figure 2:
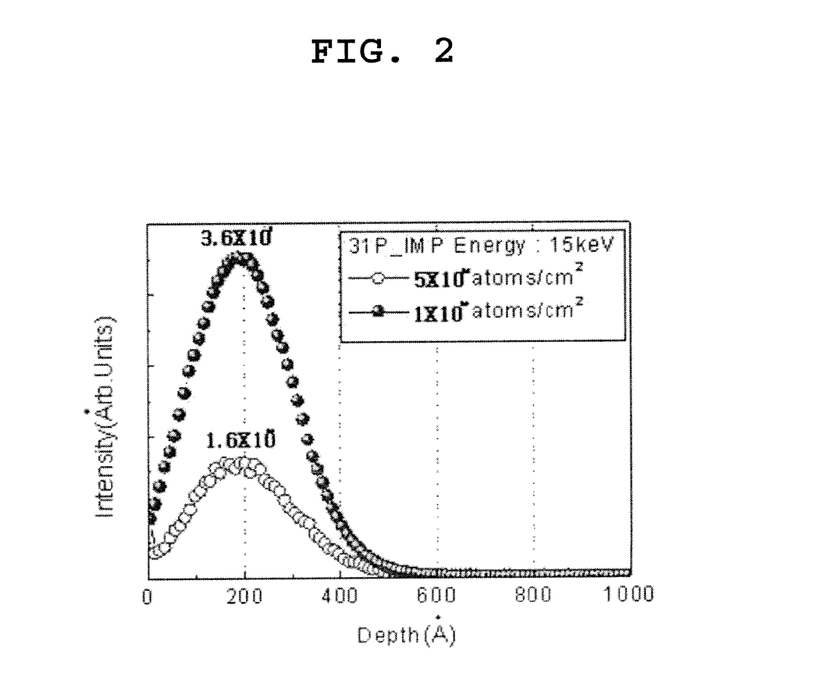
FIG. 2 is a graph illustrating ion distribution depending upon the depth of a thermal oxide layer having phosphorus ions of a given concentration implanted therein.

For example, when arsenic (As) ions, boron (B) ions, and phosphorus (P) ions are implanted in an oxide layer with the same ion implantation amount and the same ion implantation energy, the size-based relation of a wet etching rate of the oxide layer is realized in the order of an oxide layer having the arsenic ions implanted therein>an oxide layer having the phosphorus ions implanted therein>an oxide layer having the boron ions implanted therein>an oxide layer having no ions implanted therein according to the order of the atomic weight of the respective impurity ions. Referring to FIGS. 1 and 2, it is confirmed that, when phosphorus ions are implanted in an oxide layer (a thermal oxide layer) in a concentration of $5.0 \times 10^{13}$ atoms/cm$^2$ and $1.0 \times 10^{16}$ atoms/cm$^2$, the wet etching rate of the oxide layer generally increases in proportion to the distribution amount of the phosphorus ions at a depth of approximately 600 Å or less to which the phosphorus ions are implanted. Also, it is confirmed that the wet etching rate of the oxide layer increases in proportion to the implantation amount of the phosphorus ions, i.e., the wet etching rate of the oxide layer is higher when the phosphorus ions are implanted in a concentration of $1.0 \times 10^{16}$ atoms/cm$^2$ than when the phosphorus ions are implanted in a concentration of $5.0 \times 10^{13}$ atoms/cm$^2$.

However, the results of experiments performed by the present inventors revealed that when boron ions were implanted onto an oxide layer in a concentration of at least $1.0 \times 10^{16}$ atoms/cm$^2$, a new phenomenon different from the above-described general phenomenon occurred. Specifically, it was revealed that when the boron ions were implanted onto an oxide layer in a concentration of at least $1.0 \times 10^{16}$ atoms/cm$^2$, the wet etching rate of the oxide layer abruptly decreased at the depth of the oxide layer to which the boron ions were implanted.

Figure 3:
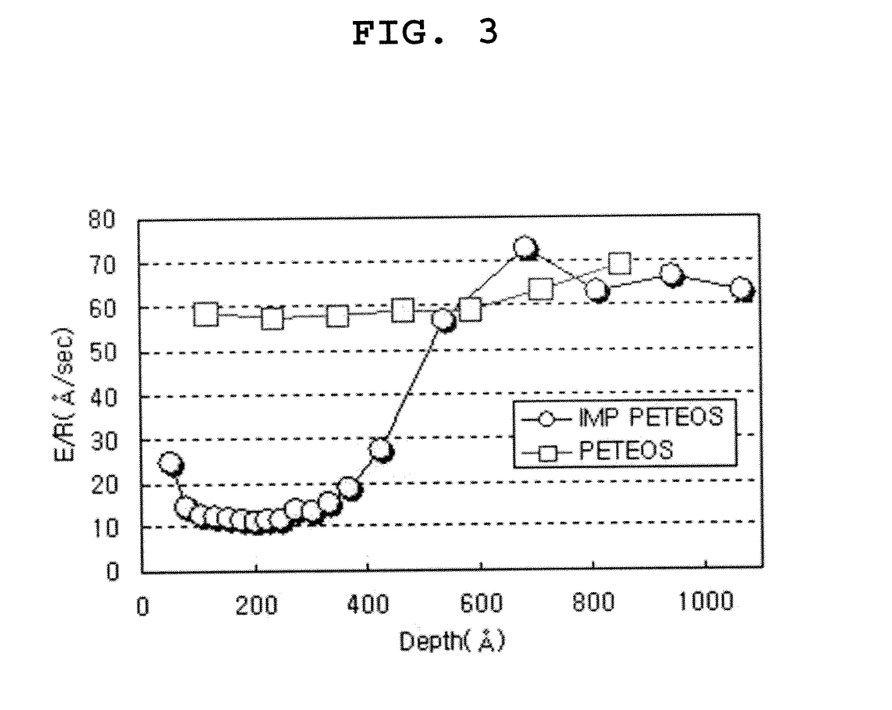
FIG. 3 is a graph illustrating the change in etching rate depending upon the depth of PE-TEOS having boron ions of a given concentration implanted therein.
Figure 5:
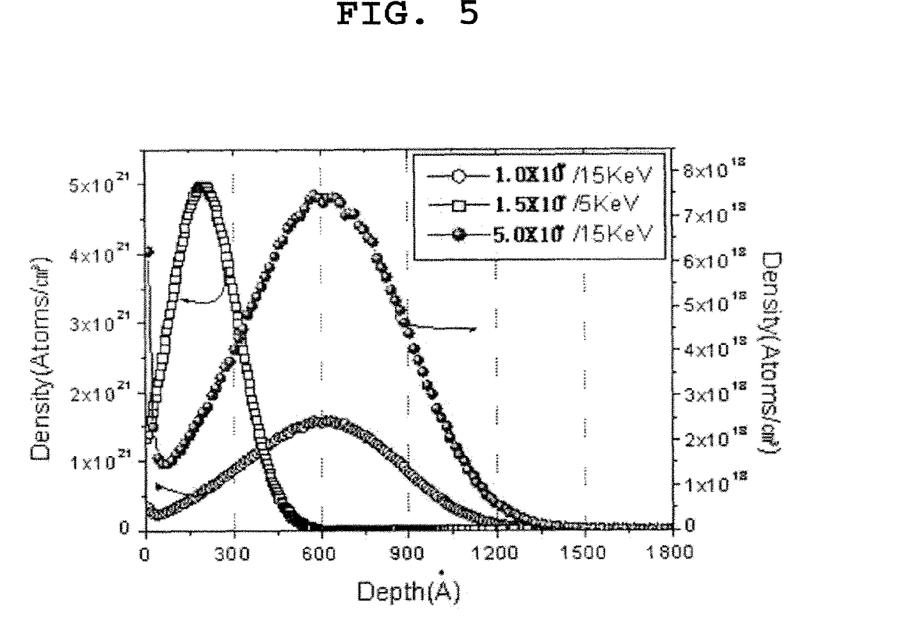
FIG. 5 is a graph illustrating ion distribution depending upon the depth of PE-TEOS having boron ions of a given concentration implanted therein.

FIGS. 3 and 5 are graphs respectively illustrating the change in etching rate and ion distribution depending upon the depth of PE-TEOS having boron ions of a given concentration implanted therein. Referring to these graphs, it is confirmed that when boron ions are implanted onto an oxide layer (PE-TEOS) in a concentration of at least $1.0 \times 10^{16}$ atoms/cm$^2$, e.g., $1.5 \times 10^{16}$ atoms/cm$^2$, the wet etching rate of the oxide layer abruptly decreases to approximately 10 Å/sec at a depth of approximately 600 Å or less to which the boron ions are implanted. It is confirmed, on the other hand, that an oxide layer having no boron ions implanted therein exhibits a wet etching rate of approximately 60 Å/sec.

Figure 4:
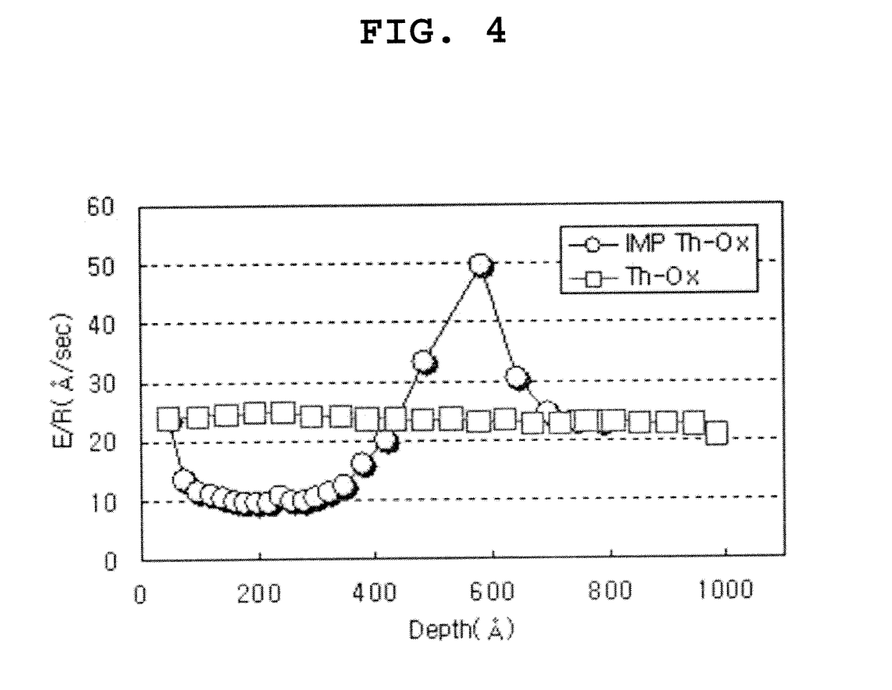
FIG. 4 is a graph illustrating the change in etching rate depending upon the depth of a thermal oxide layer having boron ions of a given concentration implanted therein.

FIG. 4 is a graph illustrating the change in etching rate depending upon the depth of a thermal oxide layer having boron ions of a given concentration implanted therein. Referring to this graph, it is confirmed that when boron ions are implanted onto an oxide layer (a thermal oxide layer) in a concentration of not less than $1.0 \times 10^{16}$ atoms/cm$^2$, e.g., $1.5 \times 10^{16}$ atoms/cm$^2$, the wet etching rate of the oxide layer abruptly decreases to approximately 10 Å/sec at a depth of the oxide layer to which the boron ions are implanted. It is confirmed, on the other hand, that an oxide layer having no boron ions implanted therein exhibits a wet etching rate of approximately 25 Å/sec.

This seems to be because, when boron ions, which have relatively small atomic size and weight, are implanted onto an oxide layer in a relatively high concentration of at least $1.0 \times 10^{16}$ atoms/cm$^2$, a chain collision between the boron ions occurs in the oxide layer at a depth of the oxide layer to which the boron ions are implanted, thereby forming a kind of etching prevention layer. This etching prevention layer prevents an etchant used for wet etching from permeating into the oxide layer with the result that the wet etching rate of the oxide layer may decrease at a depth of the oxide layer to which the boron ions are implanted.

The oxide pattern forming method according to an embodiment of the invention has been completed based on the discovery of the above-described unique phenomenon which was discovered by the present inventors. In the oxide pattern forming method according to one embodiment, boron ions are implanted onto an oxide layer in a first region in a concentration of at least $1.0 \times 10^{16}$ atoms/cm$^2$, such that the wet etching rate of the oxide layer in the given region is much lower than in the remaining region where the boron ions are not implanted.

Subsequently, wet etching is performed on the oxide layer. At this time, the oxide layer is not etched in the first region where the boron ions are implanted. On the other hand, the oxide layer is completely removed by etching in a second region where the boron ions are not implanted. Consequently, a desired oxide pattern is formed.

By the use of the oxide pattern forming method, it is possible to effectively pattern an oxide layer commonly applicable as various dielectric layers or insulation layers without forming an additional hard mask pattern or an additional photoresist pattern during a semiconductor device manufacturing process. Consequently, it is possible to greatly simplify the oxide patterning process.

Also, a hard mask pattern may be formed by using the oxide pattern forming method during a process for patterning a different kind of layer included in the semiconductor device. Specifically, it is possible to form the oxide pattern by using the oxide pattern forming method. As boron ions are implanted in a concentration of at least $1.0 \times 10^{16}$ atoms/cm², the formed oxide pattern exhibits a low wet etching rate. Consequently, it is possible to effectively protect a lower patterning target layer during the patterning process using the oxide pattern, and therefore the oxide pattern is preferably applicable as the hard mask pattern.

Especially, since the hard mask pattern is formed by using the oxide pattern forming method, it is possible to form the hard mask with a material layer commonly used during semiconductor device manufacturing processes, i.e., an oxide layer. As a result, it is unnecessary to provide an additional apparatus for forming and patterning the hard mask at the respective patterning processes for forming various components of a semiconductor device and thus to set the additional apparatus. Consequently, the semiconductor device manufacturing process is simplified, and therefore its economical efficiency increases.

In the oxide pattern forming method, on the other hand, the boron ions are implanted onto the oxide layer in a concentration of at least $1.0 \times 10^{16}$ atoms/cm². The concentration in which the boron ions are implanted practically may be empirically determined by those skilled in the art in consideration of kinds of oxide layers, the thickness of the oxide layer, and the wet etching rate desired to be obtained by implanting the boron ions onto the oxide layer in a given region within the above-specified range of concentration generated by the present disclosure. Also, the maximum concentration of the boron ions that can be implanted onto the oxide layer and the wet etching rate of the oxide layer may be changed depending upon kinds of oxide layers. The maximum concentration of the boron ions and the wet etching rate of the oxide layer may be empirically determined by those skilled in the art in consideration of the characteristics of the respective oxide layers, generated by the present disclosure.

Also, the oxide pattern forming method may be used to form an arbitrary oxide layer applicable to the semiconductor device manufacturing process. For example, the oxide pattern forming method may be used to form an arbitrary oxide layer, such as a thermal oxide layer, PE-TEOS, LP-TEOS, USG, PSG, BPSG, SOD, SiON, $O_3$-TEOS, or PE-TEOS, for example, without limits. However, as the kind of the oxide layer is changed, the wet etching rate and etch selectivity of the oxide layer may change in the first region where the boron ions are implanted and the second region where the boron ions are not implanted. Consequently, it is possible to select a suitable oxide layer in consideration of the wet etching rate and etch selectivity of the oxide layer.

When the boron ions are implanted onto the oxide layer by using the oxide pattern forming method, as described above, a kind of etching prevention layer may be formed in the oxide layer at the boron ion implantation depth Rp. This etching prevention layer prevents an etchant used for wet etching from permeating into the oxide layer, thereby decreasing the wet etching rate of the oxide layer.

The etching prevention layer formation depth is decided depending upon the boron ion implantation depth Rp. Consequently, it is possible to control the etching prevention layer formation depth by appropriately controlling at least one of the implantation amount (implantation concentration) or implantation energy of the boron ions. For example, the implantation energy of the boron ions are preferably controlled within a range of 5 KeV to 20 KeV. When the implantation energy of the boron ions is controlled to be smaller within the above-specified range, the boron ion implantation depth Rp decreases with the result that the etching prevention layer is formed near the surface of the oxide layer. When the etching prevention layer is formed near the surface of the oxide layer, the thick oxide layer below the etching prevention layer exhibits a relatively high wet etching rate equivalent to the oxide layer in the second region where the boron ions are not implanted.

Also, the boron ions are preferably implanted onto the oxide layer at an angle of 0 degrees to 10 degrees (i.e., 10 degrees or less) in consideration of kinds of oxide layers or the size or shape of an oxide pattern desired to be formed.

In the oxide pattern forming method, it is possible to form the oxide layer such that the oxide layer has an appropriate thickness in consideration of at least one of several conditions, such as kinds of oxide layers, the implantation amount (implantation concentration) and implantation energy of the boron ions, the boron ion implantation depth Rp, the thickness of the oxide layer after the pattern formation, and the size of the oxide pattern. For example, the oxide layer may be formed such that the oxide layer has a thickness greater than twice the boron ion implantation depth Rp. Also, the oxide layer may be formed such that the oxide layer has a thickness three, four, or five times greater than the boron ion implantation depth Rp, for example, in consideration of the kinds of oxide layers and the size of the oxide pattern.

In the oxide pattern forming method, on the other hand, the oxide layer is formed, the boron ions are implanted onto the oxide layer in the first region, and the oxide layer is wet-etched in the second region where the boron ions are not implanted, thereby forming the oxide pattern. At this time, the wet etching process may be performed using any suitable etchant for wet etching of the oxide layer. For example, an etchant including diluted hydrofluoric acid (DHF) or buffered oxide etchant (BOE) is preferably used during the wet etching process.

Also, the oxide pattern forming method may further comprises implanting ions of $1.0 \times 10^{15}$ atoms/cm² or less onto the oxide layer in the second region where the boron ions are not implanted before the wet etching process. This additional ion implantation process may be performed after the boron ion implantation process or before the boron ion implantation process. In the additional ion implantation process, arbitrary ions used in the semiconductor device manufacturing process, for example ions including boron, arsenic, or phosphorus, may be implanted onto the oxide layer in the second region where the boron ions are not implanted.

As the additional ion implantation process is performed, ions of $1.0 \times 10^{15}$ atoms/cm² are implanted onto the oxide layer in the second region where the boron ions are not implanted with the result that the oxide layer in the region where the ions are additionally implanted exhibits a wet etching rate higher than an oxide layer having no impurity ions implanted therein. Consequently, the etch selectivity with the oxide layer in the first region where the boron ions are implanted increases, whereby it is possible to more effectively form the oxide pattern through the use of the oxide pattern forming method.

The above-described oxide pattern forming method may be used to pattern an oxide layer commonly applicable as various dielectric layers or insulation layers during the semiconductor device manufacturing process or to selectively etch the oxide layer, without limitation. Also, the oxide pattern forming method may be used to pattern an oxide layer on a different kind of layer (a different kind of patterning target layer).

In accordance to another embodiment of the invention, a patterning method of a semiconductor device comprises sequentially forming a patterning target layer and an oxide layer on a semiconductor substrate, implanting boron ions of at least $1.0\times10^{16}$ atoms/cm$^2$ onto the oxide layer in a first region where an oxide pattern is to be formed, wet-etching the oxide layer in a second region where the boron ions are not implanted to form an oxide pattern, and patterning the patterning target layer with the oxide pattern being used as a mask.

In the patterning method of the semiconductor device according to another embodiment, a patterning target layer and an oxide layer are sequentially formed on a semiconductor substrate, and then a hard mask pattern including an oxide pattern is formed by using the oxide pattern forming method according to one embodiment. Subsequently, a lower pattern target layer is patterned using the hard mask pattern.

According to the patterning method of the semiconductor device, it is possible to easily form the hard mask pattern including the oxide pattern by the above-described oxide pattern forming method, thereby easily accomplishing the patterning of the hard mask. Also, as the boron ions are implanted onto the oxide pattern in a concentration of at least $1.0\times10^{16}$ atoms/cm$^2$, the hard mask pattern including the oxide pattern exhibits a low wet etching rate. Consequently, it is possible to effectively protect the lower pattering target layer, and therefore the hard mask pattern appropriately satisfies the requirement for a hard mask pattern.

In addition, according to the patterning method of the semiconductor device, it is possible to form the hard mask with a material layer commonly used during the semiconductor device manufacturing process, i.e., an oxide layer. As a result, it is unnecessary to provide an additional apparatus for forming and patterning the hard mask at the process for patterning the patterning target layer to form various components of a semiconductor device and thus to set the additional apparatus as compared with when the hard mask is formed using a silicon nitride, polysilicon, a tungsten nitride, tungsten, or a silicon oxy-nitride, for example. Consequently, the semiconductor device manufacturing process is simplified, and therefore its economical efficiency increases.

In the patterning method of the semiconductor device, on the other hand, it is possible to form the oxide pattern and the hard mask pattern including the oxide pattern using an arbitrary oxide layer, such as a thermal oxide layer, PE-TEOS, LP-TEOS, USG, PSG, BPSG, SOD, SiON, O$_3$-TEOS, or PE-TEOS, for example. However, as the kind of the oxide layer is changed, the wet etching rate and etch selectivity of the oxide layer may change in the first region where the boron ions are implanted and the second region where the boron ions are not implanted. Also, the thickness and wet etching rate of the residual oxide layer after forming the oxide pattern may change. Consequently, it is possible to select a suitable oxide layer in consideration of the above-mentioned conditions.

When the boron ions are implanted onto the oxide layer in the patterning method of the semiconductor device, a kind of etching prevention layer may be formed in the oxide layer at the boron ion implantation depth Rp. This etching prevention layer prevents an etchant used for wet etching from permeating into the oxide layer, thereby decreasing the wet etching rate of the oxide layer.

The etching prevention layer formation depth is determined depending upon the boron ion implantation depth Rp. Consequently, it is possible to control the etching prevention layer formation depth by appropriately controlling the implantation amount (implantation concentration) or implantation energy of the boron ions. For example, the implantation energy of the boron ions may be controlled within a range of 5 KeV to 20 KeV. When the implantation energy of the boron ions is controlled to be smaller within the above-specified range, the boron ion implantation depth Rp decreases with the result that the etching prevention layer is formed near the surface of the oxide layer. When the etching prevention layer is formed near the surface of the oxide layer, the thick oxide layer below the etching prevention layer exhibits a relatively high wet etching rate equivalent to the oxide layer in the second region where the boron ions are not implanted. Consequently, it is possible to easily remove the oxide pattern and the hard mask pattern including the oxide pattern.

Also, the boron ions may be implanted onto the oxide layer at an angle of 0 degrees to 10 degrees (i.e., 10 degrees or less) in consideration of kinds of oxide layers or the size or shape of an oxide pattern desired to be formed and the size or shape of an hard mask pattern including the oxide pattern.

In the patterning method of the semiconductor device, it is possible to form the oxide layer such that the oxide layer has an appropriate thickness in consideration of at least one of several conditions, such as kinds of oxide layers, kinds and thickness of lower patterning target layers to be patterned with the oxide pattern being used as a hard mask pattern, the implantation amount (implantation concentration) and implantation energy of the boron ions, the boron ion implantation depth Rp, the thickness of the oxide layer after the pattern formation, and the size of the oxide pattern. For example, the oxide layer may be formed such that the oxide layer has a thickness greater than twice the boron ion implantation depth Rp. Also, the oxide layer may be formed such that the oxide layer has a thickness three, four, or five times greater than the boron ion implantation depth Rp, for example, in consideration of the kinds of oxide layers and the size of the oxide pattern.

In the patterning method of the semiconductor device, on the other hand, the patterning target layer and the oxide layer are formed, the boron ions are implanted onto the oxide layer in the first region, and the oxide layer is wet-etched in the second region where the boron ions are not implanted, thereby forming the oxide pattern and the hard mask pattern including the oxide pattern.

At this time, the wet etching process may be performed using any suitable etchant generally used for wet etching of the oxide layer. For example, an etchant including diluted hydrofluoric acid (DHF) or buffered oxide etchant (BOE) is preferably used during the wet etching process. Also, the wet etching process may be performed using a method of soaking a semiconductor substrate having the oxide layer formed thereon in an etchant. At this time, the semiconductor substrate soaking time may be appropriately controlled such that the oxide pattern formed after the wet etching process and the hard mask pattern including the oxide pattern have a thickness sufficient to protect the lower patterning target layer, for example a thickness of 500 Å or more.

Also, the patterning method of the semiconductor device may further comprise implanting ions of $1.0\times10^{15}$ atoms/cm$^2$ or less onto the oxide layer in the second region where the boron ions are not implanted before the wet etching process. This additional ion implantation process may be performed after the boron ion implantation process or before the boron ion implantation process. In the additional ion implantation process, arbitrary ions used in the semiconductor device manufacturing process, for example ions including boron, arsenic, or phosphorus, may be implanted onto the oxide layer in the second region where the boron ions are not implanted.

As the additional ion implantation process is performed, ions of $1.0 \times 10^{15}$ atoms/cm$^2$ or less are implanted onto the oxide layer in the second region where the boron ions are not implanted with the result that the oxide layer in the region where the ions are additionally implanted exhibits a wet etching rate higher than an oxide layer having no impurity ions implanted therein. Consequently, the oxide pattern and the hard mask pattern including the oxide pattern are more effectively formed.

Meanwhile, in the patterning method of the semiconductor device, the oxide pattern and the hard mask pattern are formed as described above, and then the patterning target layer is patterned with the hard mask pattern including the oxide pattern being used as a mask. At this time, the patterning target layer may be patterned by dry etching. For example, the patterning target layer may be dry-etched using an ordinary etching gas according to kinds of patterning target layers.

Also, the patterning method of the semiconductor device may further comprise removing the oxide pattern after the step of patterning the patterning target layer. At this time, the oxide pattern may be removed by wet etching.

As described above, the oxide pattern exhibits a low wet etching rate at the boron ion implantation depth Rp, whereas the oxide pattern exhibits a high wet etching rate at the second region below the boron ion implantation depth Rp in the same manner as an ordinary oxide layer having no boron ions implanted therein. Consequently, the oxide pattern and the hard mask pattern including the oxide pattern may be easily removed by wet etching. Especially, particles resulting from the oxide pattern are prevented from being left over or by-products are prevented from being produced by the reaction between the oxide pattern and the lower patterning target layer during the removal of the oxide pattern. Consequently, the defective proportion of semiconductor devices decreases, and therefore the yield rate and characteristics of the semiconductor devices are greatly improved.

The patterning method of the semiconductor device may be used to pattern various kinds of patterning target layers constituting various components, such as a device isolation layer, a landing plug poly contact, a gate, a bit line, or a storage node, for example without limitation.

As an example, FIGS. 6a to 6d are views schematically illustrating a device isolation trench forming method using a patterning method of a semiconductor device according to another embodiment of the invention.

In the illustrated device isolation trench forming method, the oxide pattern and the hard mask pattern including the oxide pattern, which are formed in the patterning method of the semiconductor device, define a region where a device isolation trench is to be formed, and the patterning target layer comprises the semiconductor substrate.

Figure 6A:
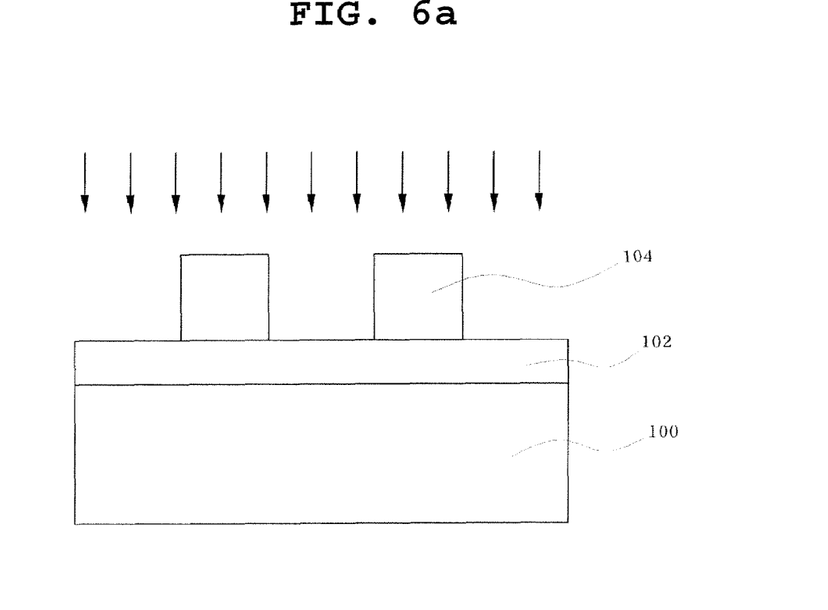
FIGS. 6a to 6d are views schematically illustrating a device isolation trench forming method using a patterning method of a semiconductor device according to another embodiment of the invention.

Referring first to FIG. 6a, an oxide layer 102 is formed on a semiconductor substrate 100, and a photoresist pattern 104 defining a first region where boron ions are to be implanted is formed on the oxide layer 102. At this time, PE-TEOS may be used as the oxide layer 102. Subsequently, boron ions are implanted onto the oxide layer 102 in a region where the oxide layer 102 is not covered by the photoresist pattern 104, for example, with an ion implantation energy of 15 KeV, an ion implantation concentration of $1.5 \times 10^{16}$ atoms/cm$^2$, and an ion implantation angle of 0 degrees.

Figure 6B:
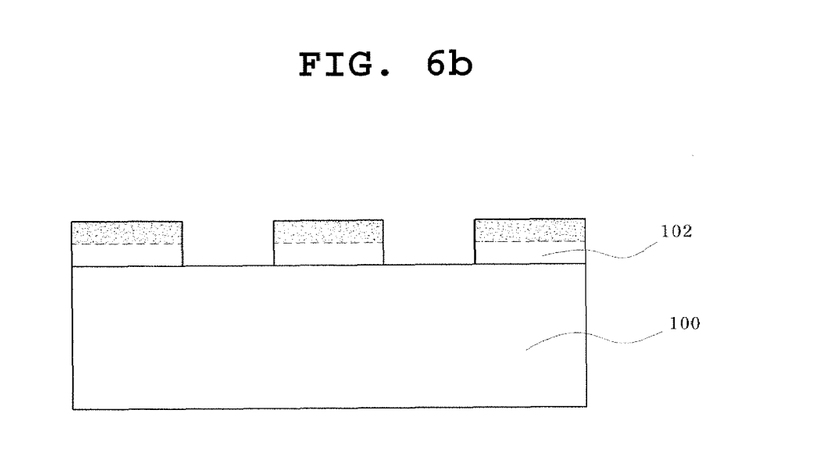
Figure 6C:
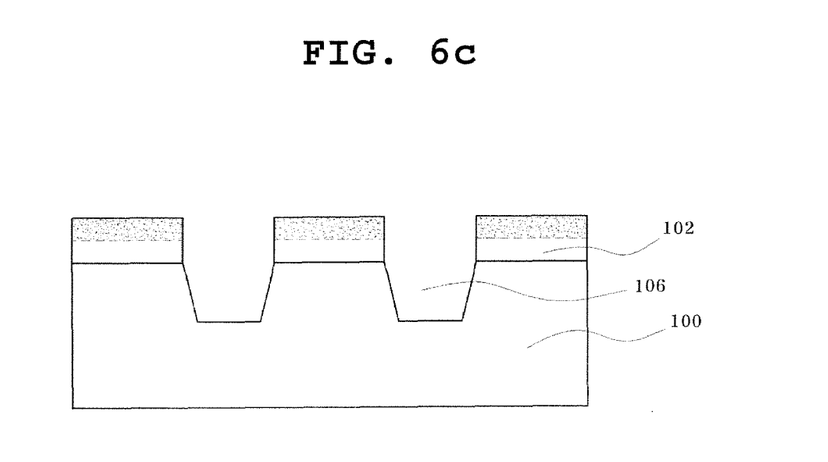

Referring to FIG. 6b, an etching prevention layer is formed at the boron ion implantation depth Rp in the oxide layer 102 in the first region where the boron ions are implanted in a concentration of $1.5 \times 10^{16}$ atoms/cm$^2$. Consequently, the oxide layer 102 in the region where the boron ions are implanted exhibits an etching rate lower than the oxide layer 102 in the second region where the boron ions are not implanted.

After the boron ions are implanted onto the oxide layer 102, the photoresist pattern 104 are removed using, for example, a Sulfuric Acid Peroxide Mixture (SPM) etchant including a sulfuric acid solution and a hydrogen peroxide solution which are mixed with each other. Subsequently, the oxide layer 102 is patterned by wet etching. As the wet etching is performed, the oxide layer 102 is hardly etched in the first region where the boron ions are implanted, whereas the oxide layer 102 is completed removed by etching in the second region where the boron ions are not implanted. As a result, the oxide layer 102 is patterned.

At this time, the wet etching process may be performed by using a method of soaking the semiconductor substrate 100 having the oxide layer 102 formed thereon in an SPM etchant including a sulfuric acid solution and a hydrogen peroxide solution which are preferably mixed in a volume ratio of 4:1 at a temperature of 165° C. to 195° C. for 5 minutes to 20 minutes.

In another embodiment, the wet etching process may be performed by using a method of soaking the semiconductor substrate 100 having the oxide layer 102 formed thereon in a BOE etchant including a hydrofluoric acid solution and an ammonium fluoride solution which are mixed in a weight ratio of 1.75%:17% at a temperature of 20° C. to 30° C. for 20 seconds to 40 seconds.

After the oxide layer 102 is patterned as described above, as shown in FIG. 6c, the semiconductor substrate 100 is etched to a given depth, with the patterned oxide layer 102 being used as a mask, to form a device isolation trench 106. At this time, the semiconductor substrate 100 may be etched by dry etching. For example, the semiconductor substrate 100 may be dry-etched using a mixture of a chlorine gas and oxygen gas which are preferably mixed in a volume ratio of 20:5. At this time, the etch selectivity of the semiconductor substrate 100 with respect to the patterned oxide layer 102 is 50 or more, and therefore the device isolation trench 106 is appropriately formed in the semiconductor substrate 100. The semiconductor substrate 100 is protected by the patterned oxide layer 102 at the region where the device isolation trench 106 is not formed. As a result, the semiconductor substrate 100 is prevented from being damaged.

Figure 6D:
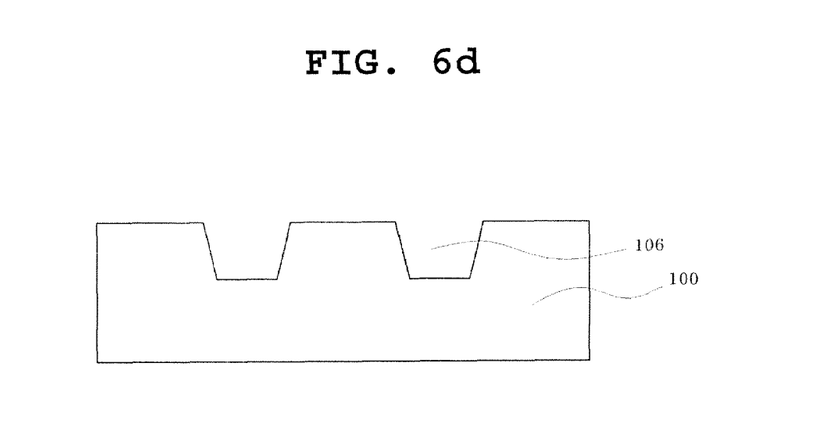

Referring to FIG. 6d, the patterned oxide layer 102 is removed after the device isolation trench 106 is formed. At this time, the oxide layer 102 exhibits a relatively high wet etching rate in the region below the etching prevention layer formation depth. Consequently, it is possible to easily remove the oxide layer 102 by wet etching. In the wet etching process, for example, the semiconductor substrate 100 having the device isolation trench 106 formed therein may be soaked in a BOE etchant for 100 seconds to 150 seconds, for example, to remove the patterned oxide layer 102.

Although the embodiments of the invention have been disclosed for illustrative purposes, various modifications, additions and substitutions are possible, without departing from the scope and spirit of the invention as disclosed in the accompanying claims.

What is claimed is:

1. An oxide pattern forming method comprising the steps of:
   forming an oxide layer on a semiconductor substrate;
   selectively implanting boron ions of at least $1.0 \times 10^{16}$ atoms/cm$^2$ into a first region of the oxide layer to a boron ion implantation depth in a first region; and
   removing a second region of the oxide layer to form an oxide pattern by wet-etching in the second region, wherein the boron ions are not implanted in the second region of the oxide layer.

2. The oxide pattern forming method according to claim 1, wherein the oxide layer includes a thermal oxide layer, Plasma Enhanced Tetraethylorthosilicate (PE-TEOS), Low-Pressure Tetraethylorthosilicate (LP-TEOS), Unodped Silicate Glass (USG), Phospho Silicate Glass (PSG), Boron-Doped Phosphosilicate Glass (BPSG), Spin-On Dielectric (SOD), Silicon Oxynitride (SiON), Ozone Tetraethylorthosilicate (O3-TEOS), or Plasma Enhanced Tetraethylorthosilicate (PE-TEOS).

3. The oxide pattern forming method according to claim 1, comprising forming the oxide layer such that the oxide layer has a thickness greater than twice the boron ion implantation depth.

4. The oxide pattern forming method according to claim 1, comprising using an etchant including diluted hydrofluoric acid (DHF) or buffered oxide etchant (BOE) in the step of wet-etching the oxide layer.

5. The oxide pattern forming method according to claim 1, further comprising:
   implanting ions of $1.0 \times 10^{15}$ atoms/cm$^2$ or less onto the oxide layer in the second region where the boron ions are not implanted before the step of wet-etching the oxide layer.

6. The oxide pattern forming method according to claim 5, wherein ions selected from the group consisting of boron, arsenic, and phosphorus, are implanted onto the oxide layer in the remaining region where the boron ions are not implanted.

7. The oxide pattern forming method according to claim 1, comprising implanting the boron ions onto the oxide layer with energy of 5 KeV to 20 KeV.

8. The oxide pattern forming method according to claim 1, comprising implanting the boron ions onto the oxide layer at an angle of 10 degrees or less.

9. The oxide pattern forming method according to claim 1, comprising patterning a patterning target layer below the oxide layer with the oxide pattern resulting from the step of wet-etching the oxide layer being used as a mask.

10. A patterning method of a semiconductor device, comprising:
    sequentially forming a patterning target layer and an oxide layer on a semiconductor substrate;
    selectively implanting boron ions of at least $1.0 \times 10^{16}$ atoms/cm$^2$ directly into a first region of the oxide layer to a boron ion implantation depth where an oxide pattern is to be formed;
    removing a second region of the oxide layer in a second region where the boron ions are not implanted to form an oxide pattern; and
    patterning the patterning target layer with the oxide pattern being used as a mask.

11. The patterning method according to claim 10, further comprising:
    removing the oxide pattern after the step of patterning the patterning target layer.

12. The patterning method according to claim 11, comprising removing the oxide pattern by wet etching.

13. The patterning method according to claim 10, wherein the oxide layer includes a thermal oxide layer, Plasma Enhanced Tetraethylorthosilicate (PE-TEOS), Low-Pressure Tetraethylorthosilicate (LP-TEOS), Undoped Silicate Glass (USG), Phospho Silicate Glass (PSG), Boron-Doped Phosphosilicate Glass (BPSG), Spin-On Dielectric (SOD), Silicon Oxynitride (SiON), Ozone Tetraethylorthosilicate (O3-TEOS), or Plasma Enhanced Tetraethylorthosilicate PE-TEOS.

14. The patterning method according to claim 10, comprising forming the oxide layer such that the oxide layer has a thickness greater than twice the boron ion implantation depth.

15. The patterning method according to claim 10, comprising using an etchant including DHF or BOE at the step of wet-etching the oxide layer.

16. The patterning method according to claim 10, further comprising:
    implanting ions of $1.0 \times 10^{15}$ atoms/cm$^2$ or less onto the oxide layer in the second region where the boron ions are not implanted before the step of wet-etching the oxide layer.

17. The patterning method according to claim 16, wherein ions selected from the group consisting of boron, arsenic, and phosphorus are implanted onto the oxide layer in the second region where the boron ions are not implanted.

18. The patterning method according to claim 10, comprising implanting the boron ions onto the oxide layer with energy of 5 KeV to 20 KeV.

19. The patterning method according to claim 10, comprising implanting the boron ions onto the oxide layer at an angle of 10 degrees or less.

20. The patterning method according to claim 10, wherein the oxide pattern defines a region where a device isolation trench is to be formed, and the patterning target layer comprises the semiconductor substrate.

* * * * *

UNITED STATES PATENT AND TRADEMARK OFFICE
CERTIFICATE OF CORRECTION

PATENT NO. : 7,588,996 B2  Page 1 of 1
APPLICATION NO. : 11/770983
DATED : September 15, 2009
INVENTOR(S) : Hyo G. Yoon et al.

It is certified that error appears in the above-identified patent and that said Letters Patent is hereby corrected as shown below:

On the Title Pg Item (30):
Please delete "10-2006-012414" and insert --10-2006-0121414--

Signed and Sealed this

Eighth Day of December, 2009

David J. Kappos
*Director of the United States Patent and Trademark Office*